METHOD AND APPARATUS FOR FORMING AN ELECTRIC BOND BETWEEN TWO METALLIC MEMBERS

Filed Nov. 23, 1964

INVENTOR
CHARLES W. SMITH 3,477,119

METHOD AND APPARATUS FOR FORMING AN ELECTRIC BOND BETWEEN TWO METALLIC MEMBERS

Charles W. Smith, Canoga Park, Calif., assignors to The Bunker-Ramo Corporation, Stamford, Conn., a corporation of Delaware Filed Nov. 23, 1964, Ser. No. 413,025
Int. Cl. B23k *31/02*
U.S. Cl. 29—497 16 Claims

ABSTRACT OF THE DISCLOSURE

A method of creating a eutectic bond between two members which method comprises the steps of placing the two members in contact with each other in the area where the bond is to be made, directing hot gas on the area where the bond is to be made to heat the members to an extent less than that necessary to create the bond and mechanically moving at least one of the members relative to the other to generate friction heat in the area of contact to thus create a bond between the members.

This invention relates to a method and apparatus for bonding together two members, more particularly, to a method and apparatus for creating a eutectic bond between two metallic members, at least one of which is not capable of withstanding throughout its entirety an elevated temperature necessary to create such a bond.

The invention will be hereinafter described as applicable to the bonding of electrical components to electrical conductors. However, it is to be understood that the method and apparatus of the invention have wide utility and are in no way limited to any specific application or materials.

In the field of electronics, recent developments have led to the production of miniature transistors known as "chip" transistors. These devices are extremely small, being of the order of a fraction of a millimeter in diameter, and are quite thin. They are well suited to be used in miniature circuitry, in which resistors and conductors are formed of thin metallic films carried by a glass or ceramic substrate. The transistor generally is made of silicon, with the base or bottom of the transistor being the collector electrode, while the base and emitter electrodes are defined by certain areas on the top or the upper side of the transistor. It is necessary to make an electrical connection between the collector electrode (the bottom of the transistor) and a thin-film conductor which usually comprises gold. It has been found in practice that the most satisfactory electrical connection between a silicon chip transistor and a gold conductor is a eutectic bond between the two members. Such a eutectic bond, however, has not heretofore been obtainable because the temperature necessary to create such a bond could not be withstood by either the transistor or the thin-film conductor without damage. For example, in the case of a silicon transistor, a temperature of approximately 375° C. is necessary to create a eutectic bond between the transistor and the gold conductor. If the entire transistor is subjected to such a temperature, it could be destroyed. Furthermore, subjecting a thin-film circuit to such a temperature may well ruin or so alter the values of any resistors in the circuit as to make it completely unusable.

The present invention solves the foregoing temperature problem by providing the required elevated temperature substantially only in the area where the bond between the members is to be made, without requiring that the entire transistor and thin-film circuit be heated to the elevated temperature. In accordance with the invention, this is accomplished by utilizing friction between the two members to be bonded to create the necessary high temperature at the bonding area. Thus the temperature of a major portion of the transistor and the major portion of the thin-film circuit may be maintained at a safe value which does not endanger either the transistor or the circuit.

In one embodiment of the invention, a silicon chip transistor to be mounted on a thin-film gold conductor is held in position on the conductor by means of a vacuum probe. The transistor and conductor are heated by means of a hot reducing gas directed thereon to a temperature of approximately 200° C., which is not high enough to damage them or to create a eutectic bond between them. The chip transistor is then subjected to mechanical motion at an ultrasonic frequency through the vacuum probe, which is connected to an ultrasonic transducer. This creates additional heat due to friction between the transistor and the conductor in the area where the bond is to be made, which raises the temperature in that area to the temperature necessary to create a eutectic bond between the transistor and the conductor.

Further features and advantages of the invention will become apparent from the following description, taken in conjunction with the accompanying drawings in which.

Figure 1:
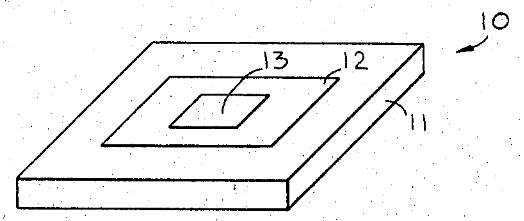
FIGURE 1 is a greatly enlarged perspective view of a chip transistor.

FIGURE 1 illustrates in greatly enlarged form a chip transistor 10, the body of which serves as a collector electrode 11, with emitter and base electrodes 12 and 13, respectively, being diffused into the upper surface of the transistor. In utilizing such a transistor, it is desirable to make a good electrical connection between the collector electrode 11 (body of the transistor) and an electrical conductor.

Figure 2:
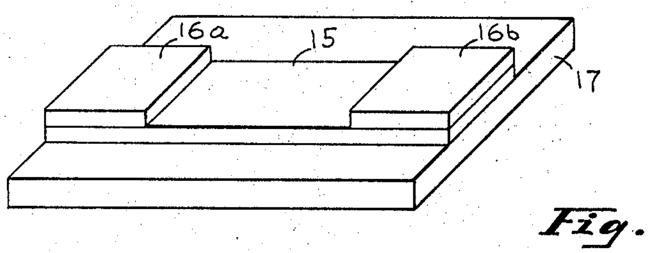
FIGURE 2 is a perspective view, again greatly enlarged and simplified, of a thin-film circuit on which the transistor of FIGURE 1 might be mounted.

In a typical application, the chip transistor 10 might be secured to a conductor on a printed circuit board or on a thin-film network of the type shown in greatly simplified form in FIGURE 2. As shown, the thin-film circuit comprises a resistor 15, a pair of conductors *16a* and *16b*, and a substrate 17 which carries the thin-film 15 and 16. It is understood that the dimensions shown in FIGURE 2 are greatly exaggerated for clarity of explanation. Furthermore, a typical thin-film circuit in practice would generally comprise many resistors and conductors rather than just the two conductors and one resistor shown.

If it is desired to create a eutectic bond between the chip transistor 10 and the conductor *16b*, for example, it is necessary that the area where the transistor and the conductor are in contact be quite hot. For example, if the transistor 10 is silicon and the conductor *16b* is gold, as is generally the case, the area where the transistor contacts the conductor must be at a temperature of approximately 375° C. in order to effect a eutectic bond between the two members. Heating the transistor to such a temperature can destroy it, and heating the thin-film circuit to such a temperature may well alter the resistance value of the resistor 15 to such an extent as to make the circuit completely unusable. Furthermore, heating to such a temperature will tend to cause oxidation and alloying of the thin films, which is also undesirable. These consequences are avoided by using the method and apparatus of the invention.

Figure 3:
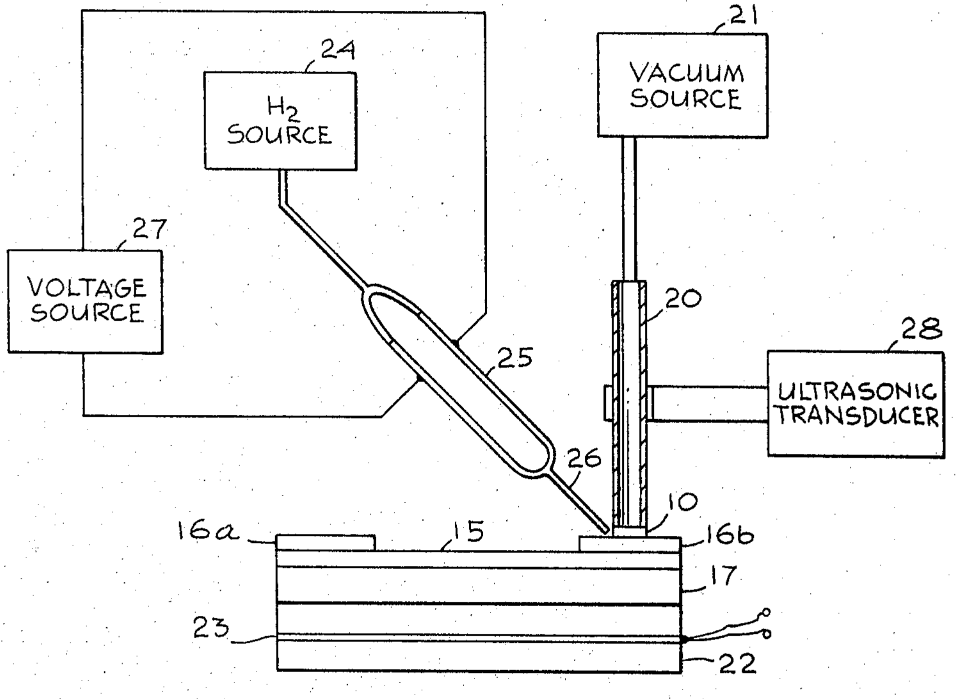
FIGURE 3 is a diagrammatic elevational view of apparatus embodying the invention for creating a eutectic bond between the members shown in FIGURES 1 and 2.

FIGURE 3 illustrates, in diagrammatic form, apparatus by means of which the method of the invention may be practiced to create a eutectic bond between the chip transistor 10 and the conductor *16b*. The chip transistor 10 is positioned on the conductor **16*b* by means of a probe 20. The probe 20 is hollow and is connected to a vacuum source 21 so that the chip transistor 10 is held on the end of the probe by means of a vacuum within the probe. The inside diameter of the probe 20 must be sufficiently large that no part of the probe comes in contact with the emitter and base electrodes 12 and 13, shown in FIGURE 1. The substrate 17, which carries the thin-film circuit to which the transistor is to be attached, is supported on a base 22 which may be heated by a conventional electric resistance heater shown at 23. The substrate 17 and the thin-film circuit carried thereby are heated to a temperature of approximately 100° C., which is insufficient to damage the thin-film circuit or the transistor 10** when it is positioned on the circuit. Of course, that temperature is not nearly high enough to effect a eutectic bond between the transistor and the conductor.

Additional heating of the contact area between the transistor 10 and the conductor **16*b* is provided by directing hot hydrogen gas at the contact area. Hydrogen is provided from a source 24 to a hollow metallic U-tube 25, which connects with a nozzle 26. The ends of the U-tube 25 are connected across a voltage source 27 so that the U-tube acts as a resistant heater to heat the hydrogen gas as it passes therethrough. When utilizing a stainless steel tube 25**, approximately .040 inch in diameter and having a current conducting path approximately 11 inches long, it has been found that approximately 10 volts applied across the tube will heat the hydrogen gas passing therethrough to a temperature of approximately 575° C.

Although the hydrogen gas directed at the contact area between the transistor and the conductor is at a high temperature, the transistor and conductor adjacent the contact area do not rise above 200° C., which is not high enough to harm either the transistor or conductors. The use of hot hydrogen gas as a heating agent has a further beneficial advantage in that at a high temperature hydrogen is an excellent reducing agent. This prevents oxidation of the thin-film circuit that would otherwise be caused by heating it.

The additional heat necessary to raise the contact area between the transistor 10 and the conductor **16*b* to approximately 375° C. to create the eutectic bond therebetween is supplied by means of friction. The friction is supplied through the vacuum probe 20 by means of an ultrasonic transducer 2 which is mechanically connected to the probe 20.. When energized, the ultrasonic transducer 28 acts to vibrate or "scrub" the transistor 10 against the conductor 16*b*** and thereby generate sufficient heat to effect the eutectic bond. It is not important whether the friction is created by moving the transistor or the substrate, but it is most convenient to move the small transistor.

In practicing the method of the invention, the substrate 17 and the thin-film circuit carried thereby are first heated to approximately 100° C. by means of the base plate heater 23. The transistor and conductor contact area is then subjected to a flow of hot hydrogen gas through the nozzle 26 for two or three seconds, at which time the ultrasonic transducer is energized to complete the bond. The ultrasonic transducer 28 need be energized for only a matter of 100 milliseconds or less to effect the bond.

The frequency of the ultrasonic energy provided from the transducer 28 is not of critical importance so long as it or one of its harmonics does not coincide or approach the natural resonant frequency of the chip transistor 10. In actual practice, it was found that the natural resonant frequency of the particular chip transistors being utilized was approximately 20 kilocycles. Therefore, an ultrasonic transducer having a frequency of 38 kilocycles was utilized.

It is now apparent that the invention provides a method and apparatus for creating a eutectic bond between two members, at least one of which cannot withstand sufficient heat throughout itself to create such a bond. Although the invention has been explained with reference to bonding a silicon transistor to a gold conductor, it is understood that it is not limited in its utility to bonding any particular materials.

I claim:

1. A method of creating a eutectic bond between two members, which comprises the steps of:
   placing the two members in contact with each other in the area where the bond is to be made,
   heating the members to a temperature less than the eutectic temperature defined by the materials of said members, and
   mechanically moving at least one of the members relative to the other to further heat the members to said eutectic temperature in the area where the bond is to be made to create said bond.

2. A method of creating a eutectic bond between two members, which comprises the steps of:
   placing the two members in contact with each other in the area where the bond is to be made,
   heating the members to a temperature less than the eutectic temperature defined by the materials of said members, and
   mechanically moving at least one of the members relative to the other at an ultrasonic frequency to further heat the members by means of friction to said eutectic temperature in the area where the bond is to be made to create said bond.

3. A method of creating a eutectic bond between two members, which comprises the steps of:
   placing the two members in contact with each other in the area where the bond is to be made,
   directing hot gas on the area where the bond is to be made to heat the members to a temperature less than the eutectic temperature defined by the materials of said members, and
   mechanically moving at least one of the members relative to the other to further heat the members to said eutectic temperature in the area where the bond is to be made to create said bond.

4. A method of creating a eutectic bond between two members, which comprises the steps of:
   placing the two members in contact with each other in the area where the bond is to be made,
   directing a hot reducing gas on the area where the bond is to be made to heat the members to a temperature less than the eutectic temperature defined by the materials of said members, and
   mechanically moving at least one of the members relative to the other to further heat the members to said eutectic temperature in the area where the bond is to be made to create said bond.

5. A method of creating a eutectic bond between two members, which comprises the steps of:
   placing the two members in contact with each other in the area where the bond is to be made,
   directing a hot reducing gas on the area where the bond is to be made to heat the members to a temperature less than the eutectic temperature defined by the materials of said members, and
   mechanically moving one of the members at an ultrasonic frequency to further heat the members to said eutectic temperature by means of friction in the area where the bond is to be made to create said bond.

6. A method of creating a eutectic bond between two members, at least one of which cannot withstand sufficient heat throughout it to create said bond, which comprises the steps of:
   placing the two members in contact with each other in the area where the bond is to be made,
   heating the members to a temperature less than the eutectic temperature defined by the materials of said members, and subjecting at least one of the members to ultrasonic vibrations to scrub the members against each other and further heat the members to said eutectic temperature in the area where the bond is to be made to create said bond.

7. Apparatus for creating a eutectic bond between two members comprising:

means for maintaining the two members in contact with each other in the area where the bond is to be made, means for heating the members to a temperature less than the eutectic temperature defined by the materials of said members, and means for subjecting at least one of the members to ultrasonic vibrations to further heat the members to said eutectic temperature in the area where the bond is to be made to create said bond.

8. Apparatus for creating a eutectic bond between two members comprising:

holding means for holding one member in contact with the other in the area where the bond is to be made, means for heating the members to a temperature less than the eutectic temperature defined by the materials of said members, and means for subjecting at least said one member to ultrasonic vibrations to further heat the members to said eutectic temperature in the area where the bond is to be made to create said bond.

9. Apparatus for creating a eutectic bond between two members comprising:

holding means for holding one member in contact with the other in the area where the bond is to be made, means for heating the members to a temperature less than the eutectic temperature defined by the materials of said members, and means for subjecting said holding means to ultrasonic vibrations to further heat the members to said eutectic temperature in the area where the bond is to be made to create said bond.

10. Apparatus for creating a eutectic bond between two members comprising:

holding means for holding one member in contact with the other in the area where the bond is to be made, means for heating the members to a temperature less than the eutectic temperature defined by the materials of said members, and means for subjecting said holding means to ultrasonic vibrations to scrub said one member against said other member to further heat the members to said eutectic temperature in the area where the bond is to be made to create said bond.

11. Apparatus for creating a eutectic bond between two members comprising:

holding means for holding one member in contact with the other in the area where the bond is to be made, means for directing a hot gas against said members to heat the members to a temperature less than the eutectic temperature defined by the materials of said members, and means for subjecting at least one of the members to ultrasonic vibrations to further heat the members to said eutectic temperature in the area where the bond is to be made to create said bond.

12. Apparatus for creating a eutectic bond between two members comprising:

holding means for holding one member in contact with the other in the area where the bond is to be made, means for directing a hot gas against said members for heating the members to a temperature less than the eutectic temperature defined by the materials of said members, and means for subjecting said one member to ultrasonic vibrations through said holding means to further heat the members to said eutectic temperature in the area where the bond is to be made to create said bond.

13. The apparatus defined by claim 12, wherein said holding means comprises a vacuum probe.

14. The apparatus defined by claim 12, wherein said last-mentioned means comprises an ultrasonic transducer mechanically coupled to said holding means.

15. The apparatus defined by claim 12, wherein said hot gas is a reducing agent.

16. The apparatus defined by claim 12, wherein said hot gas is hydrogen heated to a temperature in excess of 500° C.

References Cited

UNITED STATES PATENTS

| | | | |
|---|---|---|---|
| 2,946,120 | 7/1960 | Jones et al. | |
| 2,985,954 | 5/1961 | Jones et al. | |
| 3,145,242 | 8/1964 | Bryan. | |
| 3,325,329 | 6/1967 | Bolesky -------- | 156—285 XR |

FOREIGN PATENTS

| | | |
|---|---|---|
| 921,845 | 3/1963 | Great Britain. |
| 220,911 | 3/1959 | Australia. |

EARL M. BERGERT, Primary Examiner

P. DIER, Assistant Examiner

U.S. Cl. X.R.

29—498; 156—73, 82, 285, 497, 580; 219—128; 228—1